(12) United States Patent
Yamada et al.

(10) Patent No.: US 8,341,508 B2
(45) Date of Patent: Dec. 25, 2012

(54) SYSTEM FOR SENDING SIGNALS BETWEEN MODULES

(75) Inventors: Akira Yamada, Tokyo (JP); Yuuichi Kumazawa, Tokyo (JP); Katsumi Morikawa, Tokyo (JP)

(73) Assignee: Azbil Corporation, Tokyo (JP)

( * ) Notice: Subject to any disclaimer, the term of this patent is extended or adjusted under 35 U.S.C. 154(b) by 277 days.

(21) Appl. No.: 12/785,884

(22) Filed: May 24, 2010

(65) Prior Publication Data

US 2010/0306630 A1 Dec. 2, 2010

(30) Foreign Application Priority Data

May 28, 2009 (JP) ................................. 2009-128921

(51) Int. Cl.
*H03M 13/00* (2006.01)
(52) U.S. Cl. .......................... 714/794; 714/805; 714/715
(58) Field of Classification Search .................. 714/799, 714/800, 805, 715, 806, 48
See application file for complete search history.

(56) References Cited

U.S. PATENT DOCUMENTS 3,937,892 A * 2/1976 Bloch et al. .................... 370/438
7,929,498 B2 * 4/2011 Ozluturk et al. ............... 370/335

FOREIGN PATENT DOCUMENTS

| DE | 4339569 A1 | 5/1995 |
| DE | 4341082 A1 | 6/1995 |
| DE | 10065907 A1 | 9/2002 |
| EP | 0798895 A1 | 10/1997 |
| JP | 2001-133502 A | 5/2001 |
| WO | 9515518 A1 | 6/1995 |
| WO | 9844399 A2 | 10/1998 |

OTHER PUBLICATIONS

EP Application No. 10164198.3 Extended European Search Report & Opinion for EP 10164198.3 dated Dec. 29, 2010.
EP Application No. 10164198.3 Communication pursuant to Article 94(3) EPC dated Sep. 12, 2011.
Chinese Office Action issued in Chinese Patent Application No. 201010197422.4, dated May 30, 2012.

* cited by examiner

*Primary Examiner* — Fritz Alphonse
(74) *Attorney, Agent, or Firm* — Troutman Sanders LLP

(57) ABSTRACT

A system for transmission of signals between modules wherein, for example, it is possible to transmit reliably, between modules, information relating to, for example, the actuation of safety devices. A transmission module for transmitting a pulse signal of a specific period, which indicates the existence of information, generates, in time division, pulse signals by a plurality of signal generating units that are provided in parallel, and then combines these pulse signals into a single time series pulse signal. Then an attempt is made to output this pulse signal towards a receiving-side module through a relay for controlling the output, and the signals appearing at a normally-open terminal and at a normally-closed terminal of the relay are monitored to determine whether or not there is a failure, where the generation of the pulse signal is stopped when a failure is detected.

4 Claims, 3 Drawing Sheets

SYSTEM FOR SENDING SIGNALS BETWEEN MODULES

CROSS REFERENCE TO RELATED APPLICATIONS

The present application claims priority under 35 U.S.C. §119 to Japanese Patent Application No. 2009-128921, filed May 28, 2009, which is incorporated herein by reference.

FIELD OF TECHNOLOGY

The present invention relates to a system for sending signals between modules, capable of sending, for example, information regarding the actuation of a safety device, reliably between modules.

BACKGROUND OF THE INVENTION

An operating control system for a combustion furnace is provided with a monitoring module for monitoring interlocks pertaining to safety operations of the combustion furnace, and a combustion control module for controlling the operation of the burner in the combustion furnace. Furthermore, in the monitoring module, interlocks pertaining to safety operations of the combustion furnace are monitored, where only when the interlocks are in the normal state is a "burner operation permitted" signal sent to the combustion control module from the monitoring module, and the operation and the control of the burner is activated thereby. In this case, if, in the monitoring module, the interlocks are not in the normal state, then it is important, conversely, that the "burner operation permitted" signal not be outputted. It is also important that, in the combustion control module, that the "burner operation permitted" signal be recognized reliably.

Note that signals pertaining to these types of safety operations must be transmitted reliably, and, for example, Japanese Unexamined Patent Application Publication 2001-133502 ("JP '502") discloses a technology for detecting a failure in a harness (an open line, a ground fault, or the like) through the provision of a voltage divider circuit at both ends of the harness, when transmitting two types of signals, "H" and "L", through a harness. However, the technique disclosed in this JP '502 does no more than enable the handling of failures in the harness.

However, in transmitting the aforementioned signals pertaining to safety operations between modules, it is important that the "burner operation permitted" signal be outputted (transmitted) only when the interlocks on the sending-side module (the monitoring module) are normal. Given this, one may consider increasing the reliability through providing, in parallel, a plurality of control devices that each output the "burner operation permitted" signal when the interlocks are normal, for example, and performing the transmission only when the control devices all output the "burner operation permitted" signal.

On the other hand, in the receiving-side module (the combustion control module), it is important to recognize accurately that the signal for which the transmission has been received is the "burner operation permitted" signal. In contrast, instead of having to the "burner operation permitted" signal be simply, for example, an "H" level or an "L" level signal (voltage), one may consider having the signal itself be a pulse signal of a specific period, and adding to the signal element whether or not there is a skip in the pulse signal, to thereby transmit the information reliably.

However, even when using the pulse signal described above, the reliable production of a pulse signal is not necessarily limited to only those times wherein the interlocks are normal. That is to say, one may also consider the case wherein the pulse generating circuit is malfunctioning. Given this, one may consider control that outputs the pulse signal using a relay, together with control for reducing the pulse signal depending on the interlocks. However, when a relay is used in parallel, there are the new problems of not being able to control the output of the pulse signal due to a failure of a relay (that is, when a relay contact point fuses).

The present invention is based on the perspective described above, and the object thereof is to provide a system for transmitting signals between modules that enables reliable transmission, between modules, of information pertaining to the actuation of safety mechanisms.

SUMMARY OF THE INVENTION

The system for transmitting signals between modules as set forth in the present invention, by which to attain the object described above is structured including a sending-side module for transmitting a pulse signal of a specific period that indicates the existence of data, and a receiving-side module that detects the existence of the data by receiving the pulse signal that is transmitted from the sending-side module, wherein:

the sending-side module comprises a plurality of signal generating units, provided in parallel, for generating the pulse signal through time division;

a pulse signal synthesizing unit for combining into a single time series pulse signal the pulse signals generated by each of the individual signal generating units;

an output circuit, made from a relay that, when not driven, connects between a common terminal and a normally-closed terminal, and, when driven, connects between the common terminal and a normally-open terminal, to input, into the common terminal, the pulse signal that has been combined into a single signal by the signal synthesizing unit, and to output this pulse signal from the normally-open terminal towards the receiving-side module; and a relay driving unit for driving the relay only when all of the plurality of signal generating units are operating to generate the pulse signals; and wherein the plurality of signal generating units operates cooperatively in each generating the pulse signals, and detects whether or not the pulse signal is at the normally-open terminal of the relay and detects whether or not the pulse signal is at the normally-closed terminal of the relay, to evaluate a failure of the pulse signal that is outputted to the receiving-side module, to stop the generation of the pulse signal if a failure is detected.

The receiving-side module is structured so as to determine that there is data when the pulse signal continues over a predetermined time interval.

Note that the plurality of signal generating units may be structured so as to determine that there is no failure if the pulse signal is outputted only from the normally-open terminal of the relay when the relay is driven, and the pulse signal is outputted only from the normally-closed terminal of the relay when the driving of the relay is stopped, and structured so as to determine that there is a failure otherwise.

Furthermore, preferably the plurality of signal generating units is structured so that, when the driving of the relay is stopped, it is determined that there is a relay failure if the pulse signal is detected simultaneously from the normally-open terminal and the normally-closed terminal of the relay.

Given the structure set forth above, the sending-side module generates a single time series pulse signal by a combining pulse signals generated through time division by the plurality of signal generating units and this time series pulse signal is transmitted to the receiving-side module through a relay, enabling the easy and reliable identification of an interruption in the signal that indicates the presence of data, from a skip in the pulse signal on the receiving-side module. Furthermore, on the sending-side module, the monitoring of the signals (pulse signals) that appear, respectively, at the normally-open contact point and the normally-closed contact point of the relay when the relay is driven and when the relay is not driven enables the easy evaluation as, to whether or not a failure has occurred in the relay, or the like (that is, a self-diagnostic function). Consequently, stopping the pulse signal generating operation itself when a failure has occurred can prevent effectively the transmission of an incorrect signal to the receiving-side module.

DETAILED DESCRIPTION OF THE INVENTION

The system for transmitting signals between modules as set forth in one example of embodiment according to the present invention will be explained below in reference to the figures.

Figure 1:
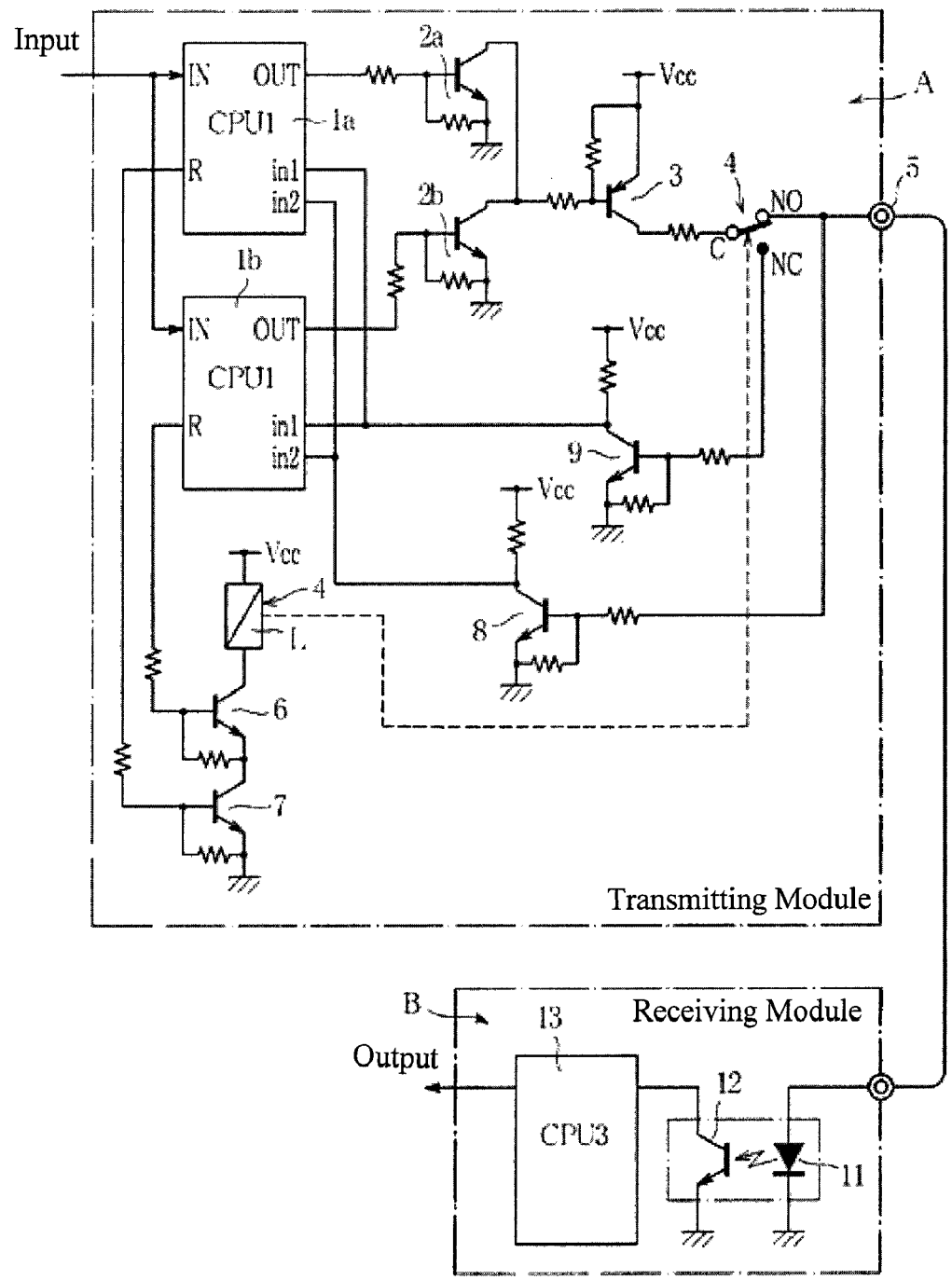
FIG. 1 is a diagram showing an example of a structure for a sending-side module and a receiving-side module for achieving the system for transmission of signals between modules according to one example of embodiment according to the present invention.

FIG. 1 is a diagram illustrating an example of a structure for a sending-side module and a receiving-side module for achieving the system for transmitting signals between modules. In FIG. 1, A is a transmitting module (monitoring module) for monitoring interlocks in, for example, a combustion furnace and for outputting a "burner operation permitted" signal, and B is a receiving module (combustion controlling module) for receiving the "burner operation permitted" signal and controlling the combustion of the burner.

The transmitting module A is provided with two control devices (CPUs) $1a$ and $1b$, in parallel, that input interlock signals and generate pulse signals of specific periods, where information (a pulse signal) indicating the existence of an interlock signal is produced in multiplex (duplex), to increase the reliability of the information (the pulse signal). Note that the control devices (CPUs) $1a$ and $1b$ fundamentally have various roles (such as the process for purging the combustion furnace) in the control of operation (the combustion control) of the combustion furnace, and perform the function as a signal generating unit for generating, through time division, pulse signals which, in general, operate synchronized with each other in providing notification of the "burner operation permitted" to the receiving module (the combustion controlling module) B, described above.

Specifically, each of the individual control devices (CPUs) $1a$ and $1b$ is structured so as to generate pulse signals with periods of 20 ms, made from square waves with a 50% duty cycle, alternatingly every 100 ms, for example. Then the respective pulse signals that are outputted from the individual control devices (CPUs) $1a$ and $1b$ are combined together through a logical adding circuit (a pulse signal synthesizing unit) made from transistors $2a$ and $2b$ to produce a pulse signal (pulse signal train) that continues in a time series with a specific driver, which is transmitted to the receiving module B side through an output transistor 3.

Note that a relay (switch) 4, for controlling the external outputting of a pulse signal that is outputted from the output transistor 3, is inserted in series in the output stage of the transmitting module A, where it is only when this relay 4 is ON (when driven) that the pulse signal is outputted to the outside through the normally-open contact point (NO).

Specifically, this relay 4 is of a type wherein the common terminal C is connected to the normally-closed contact point (and C) side when an electromagnetic coil L is not driven (when OFF), and the common terminal C is switched to be connected to the normally-open contact point NO side when a current is driven for the electromagnetic coil L (when ON).

Given this, in the present form of embodiment, the common contact point C of the relay 4 is connected to the output terminal (the collector of a PNP transistor 3 wherein the emitter is connected to ground) of the output transistor 3, when the normally-open contact point NO is connected to the external output terminal 5. Consequently, by driving the current in the relay 4, a time series pulse signal wherein the outputs from the controlling devices $1a$ and $1b$ are gathered together into a single pulse signal, through logical adding circuits (transistors $2a$ and $2b$) is transmitted to the receiving module B through the normally-open contact point NO of the relay 4 from the output transistor 3.

Note that the electromagnetic coil L of the relay 4 has the current therein controlled through a relay driving circuit comprising two transistors 6 and 7 which are connected in series, having the conductivities thereof driven through the reception of relay driving signals from the control devices $1a$ and $1b$. Consequently, the relay 4 is driven through the relay controlling circuit (transistors 6 and 7) only when the relay driving signals are outputted simultaneously from the controlling devices $1a$ and $1b$. Additionally, if one or both of the controlling devices $1a$ and $1b$ were to stop outputting the relay driving signal, then the OFF operation by either the transistor 6 or the transistor 7 would stop the operation of the entire relay 4.

Furthermore, the transmitting module A is provided with a transistor 8 as a monitoring circuit for monitoring the pulse signal that is outputted to the outside through the normally-open contact point NO of the relay 4, and a transistor 9 as a monitoring circuit for monitoring the pulse signal that should appear at the normally-closed contact point NC of the relay 4 when the relay 4 is in a non-driven state. Given this, the pulse signals that are detected through the respective transistors 8 and 9 (monitoring circuits) are applied respectively to the individual control devices $1a$ and $1b$ as the output monitoring results in1 and in2, so as to provide a self-diagnostic for the function of the transmitting module A.

Note that the receiving module B, as described above, is structured so as to detect, through a photocoupler that is structured from a light-emitting element 11 and a light-detecting element 12 that is optically coupled to the light-emitting element 11, the pulse signal that has been transmitted from the transmitting module A, where the controlling device 13 that inputs this received signal is structured so as to recognize, as the aforementioned "burner operation permitted" signal, a case wherein the aforementioned pulse signal continues over at least a specific period of time (for example, 500 ms). In other words, if the continuous time interval for the pulse the signal does not fulfill the set time interval (for example, 500 ms), then the controlling device 13 determines that the "burner operation permitted" signal has been canceled, or that the "burner operation permitted" signal was not sent due to a failure of some sort in the transmitting module A.

The failure detecting process in the transmitting module A, structured as described above, will be explained here. When all of the individual elements that structure the transmitting module A, such as the relay 4, are functioning properly, then alternating pulse signals are outputted at specific time intervals, as illustrated in, for example, FIG. 2, depending on the input of the interlock signals from the two control devices (CPUs) 1 and 2 that are provided in parallel. However, during the interval until the control devices 1 and 2 confirm that the transmitting module A is functioning properly, the relay 4 is not driven. Consequently, the pulse signals that are outputted from the individual control devices 1 and 2, as described above, are combined into a single time series pulse signal through a logical adding circuit (transistors 2a and 2b), where this time series pulse signal is provided from the output transistor 3 to the relay 4.

Figure 2:
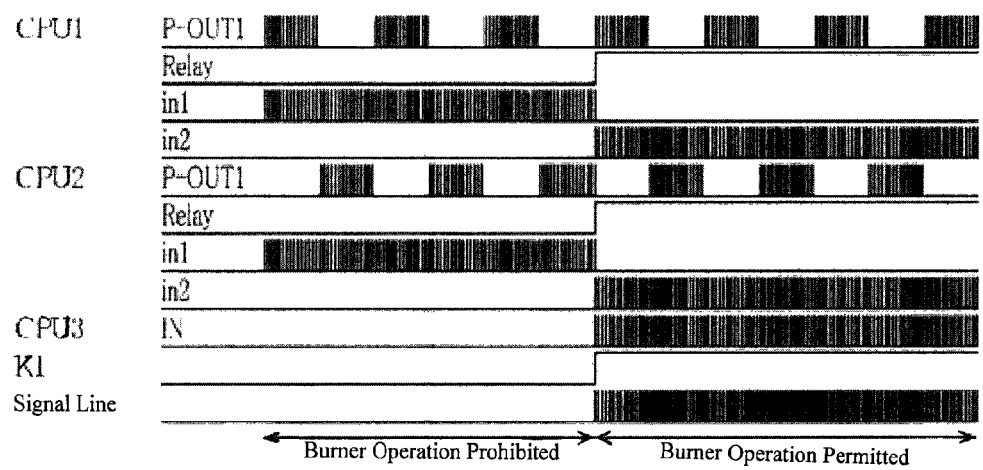
FIG. 2 is a timing chart illustrating the state of operation when there is no failure.

However, if there is a failure in the relay 4, then the pulse signal will be outputted from the normally-closed contact point side of the relay 4, rather than being outputted from the normally-open contact point NO side, when the relay 4 is not driven. The result is that, as illustrated in FIG. 2, the pulse signal that is detected from the normally-closed contact point NC side of the relay 4 will be inputted into the first monitoring input port in1 of the control devices 1 and 2, rather than the pulse signal being inputted into the second monitoring input port in2. The individual controlling devices 1 and 2 determine, from this type of monitoring result, that the relay 4 has not failed, and, at this time, generate a driving signal for the relay 4.

When this is done, these relay driving signals are received to cause the transistors 6 and 7 of the relay driving circuits to drive the relay 4, switching the output contact point. The result is that, as illustrated in FIG. 2, the time series pulse signal that has been combined together as described above will be sent to the receiving module B side through the external contact terminal 5 from the normally-open contact point NO side of the relay 4. Simultaneously, the pulse signal ceases to be outputted to the normally-closed contact point NC side of the relay 4. That is, the pulse signal ceases to be inputted into the first monitoring input port in1 in each of the control devices 1 and 2, and instead the pulse signal is inputted into the second monitoring input port in2. The determinations are made in the control devices 1 and 2 that the relay 4 is functioning properly, based on these monitoring results.

Then, at this time, the pulse signal that is transmitted to the receiving module B side through the external contact terminal 5 combines the pulse signals that are generated alternatingly by the individual control devices 1 and 2 to be a single combined continuous pulse signal train, and thus has the meaning of the aforementioned "burner operation permitted" signal. Consequently, there will be no outputting of a "burner operation permitted" signal unintentionally from the transmitting module A.

Note that in the case wherein the pulse signal is not produced properly from either one of the control devices 1 or 2, or a case wherein there is a failure of a transistor 2a or 2b as the pulse signal synthesizing unit, then, as described above, the single combined time series pulse signal will not be produced. Consequently, in such a case it will be determined that there has been a failure on the side of one of the control devices 1 or 2, and thereafter the pulse signal generation will be terminated. Furthermore, if the pulse signal itself is not detected, notwithstanding the actuation of the control devices 1 and 2, then, similarly, it will be determined that some sort of failure has occurred.

Figure 3:
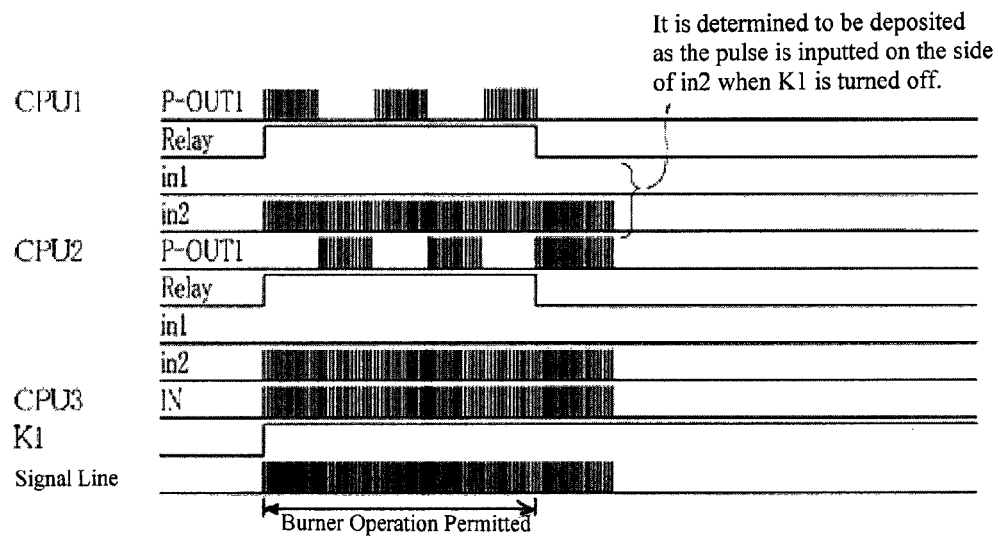
FIG. 3 is a timing chart illustrating the state of operation when there is a failure wherein the common contact point and the usually open contact point of the relay have fused together.

Note also that a contact point fault in the relay 4 is produced through fusing between contact points, caused by electric discharge between the contact points, when the relay 4 is driven. Consequently, in detecting the fault in the relay 4, the driving should be stopped from a state wherein the relay 4 is driven, and, at that time, the monitoring statuses in the aforementioned first and second monitoring input ports in1 and in2 should be checked. Specifically, if the common contact point C and the normally-open contact point NO of the relay 4 have been fused together, then even when the driving of the relay 4 has been stopped, the movable contact piece does not return to the normally-closed contact point NC side. As a result, in this case the outputting of the pulse signal to the normally-open contact point NO side (the first monitoring input port in2) will continue regardless of the driving of the relay 4 having been stopped, as illustrated in FIG. 3, and, on the other hand, the pulse signal will not appear on the normally-closed contact point NC side of the relay 4 (the first monitoring input port in1).

Consequently, in each of the control devices 1 and 2, described above, a determination is made that a failure has occurred in the relay 4, based on the monitoring results, and, for example, the generation of the pulse signals itself is stopped. The result is that the transmission of the pulse signal to the receiving module B is forcibly terminated. In particular, even in a case wherein the driving of the relay 4 has been stopped and the transmission of the pulse signal should be terminated, if there is a failure in the relay 4, this stops the generation of the pulse signal itself in the control devices 1 and 2, thereby prohibiting the transmission of the pulse signal to the receiving module B thereafter.

Figure 4:
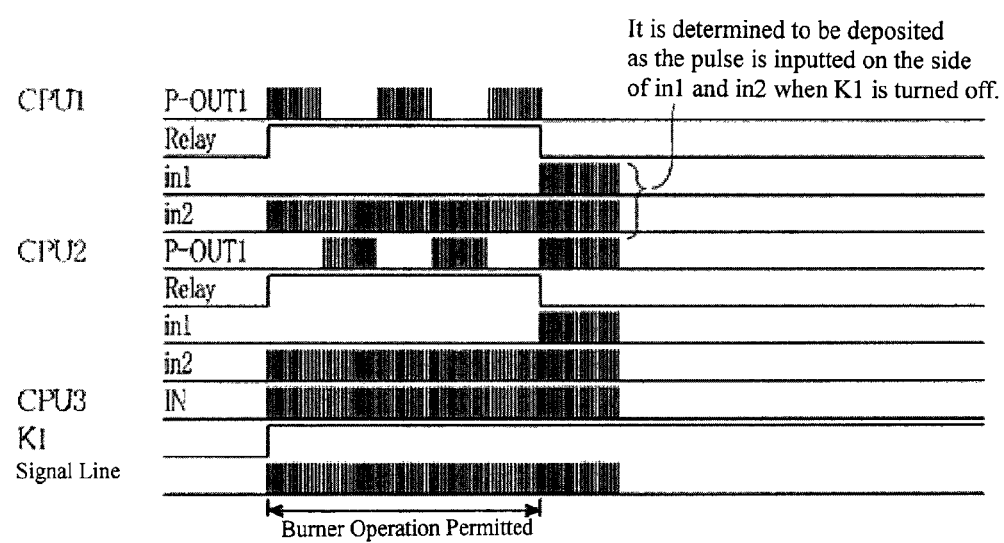
FIG. 4 is a timing chart illustrating the state of operation when there is a failure wherein the common contact point, the normally-open contact point, and the normally-closed contact point of the relay have fused together.

Note that as one mode of failure of the relay 4, there is a case wherein, in addition to the normally-open contact point NO being fused to the common contact point C, the normally-closed contact point NC is also, simultaneously, fused thereto. Because of this, when such a situation occurs, the outputting of the pulse signal from the normally-open contact point NO side of the relay 4 (the monitoring input port in2) will continue, as illustrated in FIG. 4, and the pulse signal will also appear at the normally-closed contact point NC side of the relay 4 (the monitoring input port in1), regardless of the relay 4 being driven or the driving thereof having been stopped. Consequently, it may be determined in each of the control devices 1 and 2, based on these monitoring results as well, that a failure has occurred in the relay 4, and the pulse signal generation itself may be stopped, to forcibly terminate the transmission of the pulse signal to the receiving module B.

That is, given the transmission module structured as described above, if the burner operation is permitted or prohibited through controlling the driving of the relay 4 by the state wherein pulse signals are generated alternatingly from the two control devices 1 and 2, then, when there is no failure, the pulse signal will be detected only on the normally-open contact point NO side of the relay 4 (the monitoring input port in2) while the burner operation is permitted, and, conversely, while the burner operation is prohibited, the pulse signal will be detected only on the normally-closed contact point NC side (the monitoring input port in1), and thus if any other status appears, it is then possible to detect this as some sort of failure having occurred in the transmitting module A. Additionally, prohibiting the pulse signal generation itself through the control devices 1 and 2 went a failure is detected prevents the transmission of incorrect information to the receiving module B.

Note that when a failure has occurred in one of the two aforementioned control devices 1 and 2, then the pulse signal from the control device on the side wherein the failure has occurred will cease to be outputted. Consequently, even if there is a time series conversion of the pulse signals through the logical adding circuit (the transistors 2a and 2b), that output will only be those pulse signals the outputted from the one control device. Consequently, there will be intermittent skips in the pulse signal of the predetermined period, making it possible to detect the failure of the other control device. Consequently, prohibiting the generation of the pulse signal in the control device on the side that is functioning properly enables the reliable prevention of the outputting of an incorrect pulse signal from the transmitting module A.

In a structure as described above, if there is a fault in a transistor 2a, 2b, or 3, then it will not be possible to obtain the single combined continuous time series pulse signal. Furthermore, if there is a fault in a transistor 6 or 7, then the relay 4 cannot be turned ON or OFF. Consequently, monitoring the signals that are detected by the monitoring input ports in1 and in2, described above, makes it possible to detect even this type of failure. Consequently, it is possible to transmit reliably the "burner operation permitted" information to the receiving module B as a continuous pulse circuit over at least a specific time period exclusively when the transmitting module A is functioning properly.

Note that the present invention is not limited to the form of embodiment set forth above. For example, while here two control devices 1a and 1b were provided in parallel, three or more control devices may instead be provided in parallel, and the production of the pulse signal may be multiplexed. Additionally, a variety of different forms for, for example, the period with which the pulse signals are produced, are possible in accordance with the application for the information transmission. Furthermore, when generating the pulse signals alternatingly from the two control devices 1a and 1b, it is possible to control the generation of the pulse signals in a complementary manner by the two control devices 1a and 1b, or the timing with which the pulse signals are generated may be set automatically while counting the number of pulses in the pulse signals generated by another control device. It embodiment of a variety of other forms are possible in a scope that does not deviate from the spirit or intent of the present invention.

The invention claimed is:

1. A system for transmitting signals between monitors, comprising a sending-side module for transmitting a pulse signal of a specific period that indicates the existence of data, and a receiving-side module that detects the existence of the data by receiving the pulse signal that is transmitted from the sending-side module, wherein:

the sending-side module comprises:
a plurality of signal generating units, provided in parallel, for generating the pulse signal through time division;
a pulse signal synthesizing unit for combining into a single time series pulse signal the pulse signals generated by each of the individual signal generating units;
an output circuit, made from a relay that, when not driven, connects between a common terminal and a normally-closed terminal, and, when driven, connects between the common terminal and a normally-open terminal, to input, into the common terminal, the pulse signal that has been combined into a single signal by the signal synthesizing unit, and to output this pulse signal from the normally-open terminal towards the receiving-side module; and
a relay driving unit for driving the relay only when all of the plurality of signal generating units are operating to generate the pulse signals; and wherein
the plurality of signal generating units operates cooperatively in each generating the pulse signals, and detects whether or not the pulse signal is at the normally-open terminal of the relay and detects whether or not the pulse signal is at the normally-closed terminal of the relay, to evaluate a failure of the pulse signal that is outputted to the receiving-side module, to stop the generation of the pulse signal if a failure is detected.

2. A system for transmission of signals as set forth in claim 1, wherein:
the receiving-side module is structured so as to determine that there is data when the pulse signal continues over a predetermined time interval.

3. A system for transmission of signals as set forth in claim 1, wherein:
the plurality of signal generating units is that which determines that there is no failure if the pulse signal is outputted only from the normally-open terminal of the relay when the relay is driven, and if the pulse signal is outputted only from the normally-closed terminal of the relay when the driving of the relay is stopped, and determines that there is a failure otherwise.

4. A system for transmission of signals as set forth in claim 1, wherein:
the plurality of signal generating units is that which, when the driving of the relay is stopped, determines that there is a relay failure if the pulse signal is detected simultaneously from the normally-open terminal and the normally-closed terminal of the relay.

* * * * *